(12) United States Patent
Endo et al.

(10) Patent No.: US 7,855,132 B2
(45) Date of Patent: Dec. 21, 2010

(54) METHOD OF MANUFACTURING BONDED WAFER

(75) Inventors: Akihiko Endo, Yamagata (JP);
Nobuyuki Morimoto, Yamagata (JP)

(73) Assignee: Sumco Corporation, Tokyo (JP)

( * ) Notice: Subject to any disclaimer, the term of this patent is extended or adjusted under 35 U.S.C. 154(b) by 463 days.

(21) Appl. No.: 12/057,896

(22) Filed: Mar. 28, 2008

(65) Prior Publication Data
US 2008/0248630 A1    Oct. 9, 2008

(30) Foreign Application Priority Data
Apr. 3, 2007    (JP) .............................. 2007-097197

(51) Int. Cl.
*H01L 21/425* (2006.01)
(52) U.S. Cl. ............... 438/522; 438/515; 257/E21.317; 257/E21.306
(58) Field of Classification Search .......... 257/E21.317, 257/E21.306, E21.324; 438/522, 515
See application file for complete search history.

(56) References Cited

U.S. PATENT DOCUMENTS

| | | | |
|---|---|---|---|
| 5,998,281 A | 12/1999 | Aga et al. | |
| 6,372,609 B1 | 4/2002 | Aga et al. | |
| 6,455,398 B1 * | 9/2002 | Fonstad et al. | 438/459 |
| 6,835,633 B2 * | 12/2004 | Boyd et al. | 438/409 |
| 2007/0161199 A1 | 7/2007 | Morita | |
| 2007/0184631 A1 | 8/2007 | Nakamura et al. | |
| 2007/0287205 A1 | 12/2007 | Kubota | |
| 2007/0298618 A1 | 12/2007 | Koyata et al. | |
| 2008/0020496 A1 | 1/2008 | Yamashita et al. | |
| 2008/0061452 A1 | 3/2008 | Nishihata et al. | |

FOREIGN PATENT DOCUMENTS

| | | |
|---|---|---|
| JP | 9-116125 | 5/1997 |
| JP | 2000-124092 | 4/2000 |
| JP | 2003-142668 | 5/2003 |
| KR | 2000-27386 | 5/2000 |
| WO | 2005/074033 | 8/2005 |
| WO | 2008/004591 | 1/2008 |

OTHER PUBLICATIONS

Korean Office Action dated Feb. 11, 2010 that issued with respect to patent family member Korean Patent Application No. 10-2008-0030759, along with an English language translation.
English language Abstract of JP 9-116125.
English language Abstract of JP 2000-124092.

* cited by examiner

*Primary Examiner*—Caridad M Everhart
(74) *Attorney, Agent, or Firm*—Greenblum & Bernstein, P.L.C.

(57) ABSTRACT

The present invention provides a method of manufacturing a bonded wafer. The method includes forming an oxygen ion implantation layer in an active layer wafer having a substrate resistivity of 1 to 100 mΩcm by implanting oxygen ions in the active layer wafer, bonding a base wafer and the active layer wafer directly or through an insulating layer to form a bonded wafer, heat treating the bonded wafer to strengthen the bond and convert the oxygen ion implantation layer into a stop layer, grinding, polishing, and/or etching, from the active layer wafer surface side, the bonded wafer in which the bond has been strengthened to expose the stop layer on a surface of the bonded wafer, removing the stop layer, and subjecting the bonded wafer from which the stop layer has been removed to a heat treatment under a reducing atmosphere to diffuse an electrically conductive component comprised in the active layer wafer.

9 Claims, 3 Drawing Sheets

Oxygen ion-implantation - etch stop/polish stop process

P-substrate

P+substrate

METHOD OF MANUFACTURING BONDED WAFER

CROSS-REFERENCE TO RELATED APPLICATIONS

This application claims the benefit of priority under 35 USC 119 to Japanese Patent Application No. 2007-097197, filed on Apr. 3, 2007, which is expressly incorporated herein by reference in its entirety.

BACKGROUND OF THE INVENTION

1. Field of the Invention

The present invention relates to a method of manufacturing a semiconductor substrate. More particularly, the present invention relates to a method of manufacturing an oxygen ion-implanted—etch/polish stop bonded substrate affording improved $SiO_2/Si$ interface roughness by using a wafer with a substrate resistivity of 1 to 100 mΩcm as a wafer on the active layer side. The manufacturing method of the present invention can be applied to both silicon-on-insulator (SOI) and direct silicon bonding (DSB) substrates.

2. Discussion of the Background

In contrast to conventional silicon wafers, SOI wafers provide superior features, such as device isolation, reduced parasitic capacitance between device and substrate, and the ability to form three-dimensional structures. Thus, they are employed in high-speed, low power consumption LSIs ("large-scale integration"). Methods of manufacturing SOI wafers by bonding, in which two silicon wafers on which oxide films have been formed are bonded together and a SOI layer (active layer) is then bonded by grinding and polishing, are known. The Smart Cut method (registered trademark) is included among these bonding methods (see Japanese Unexamined Patent Publication (KOKAI) Heisei No. 9-116125 or English language family member U.S. Pat. No. 6,372,609, Japanese Unexamined Patent Publication (KOKAI) No. 2000-124092 or English language family member U.S. Pat. No. 5,998,281, which are expressly incorporated herein by reference in their entirety).

In SOI wafers, thinning of the SOI layer (active layer) and uniform film thickness are desirable. Thus, a new method for such purposes has been developed. In this new method, an active layer wafer having an oxygen ion implantation layer and a base layer wafer are bonded together, the oxygen ion implantation layer is converted to a $SiO_2$ layer by heat treatment, grinding and polishing are conducted from the active layer wafer side through to the $SiO_2$ layer, and the $SiO_2$ layer is removed to obtain a wafer with a thin SOI layer (active layer) of uniform film thickness. WO 2005/074033 A1 or English language family member US2007/0161199 A1, which are expressly incorporated herein by reference in their entirety, discloses the aforementioned method. The oxygen ion implantation layer functions as a polish stop layer.

In recent years, device miniaturization and the reduction of power consumption have resulted in a thinning of the BOX oxide film. Further, directly bonded DSB substrates have been developed in which bonding is conducted without a BOX (oxide film), for example. When directly bonding without an oxide film, the wafers are bonded after conducting the usual cleaning (SC1).

However, the bonding method employing the polish stop layer described in WO 2005/074033 A1 presents the following problems:

(1) There is substantial roughness at the interface between the silicon substrate and the layer containing $SiO_2$ phase particles or the continuous $SiO_2$ layer serving as the polish stop layer, resulting in great roughness of the outer surface of the bonded wafer that is a final product;

(2) Thus, after fabricating the SOI structure, it becomes necessary to conduct additional processing in the form of polishing or a high-temperature heat treatment at 1,100° C. for one hour to improve surface roughness; and (3) Problems relating to quality caused by deterioration of in-plane uniformity of the top layer (active layer) due to the additional processing.

The same problems as in (1) occur in bonding methods employing a polish stop layer, both in SOI substrates and DSB substrates.

SUMMARY OF THE INVENTION

An aspect of the present invention provides for a method of manufacturing a final product in the form of a bonded substrate having low surface roughness by suppressing interface roughness between an etching/polish stop layer in the form of a $SiO_2$ layer and a silicon substrate in a bonding method employing an etching/polish stop layer. The bonded substrate includes SOI substrates and DSB substrates.

It is conventionally known that implanted oxygen ions react with the surrounding silicon, becoming $SiO_2$ that functions as a stop layer in subsequent processing, and that $SiO_2/Si$ interface roughness can be improved by promoting such a $SiO_2$ reaction. To promote the above reaction, it has been necessary to maintain an ultra-high temperature of equal to or greater than 1,300° C. for an extended period. However, even when an ultra-high temperature heat treatment is conducted following bonding, the $SiO_2$ reaction has been found not to progress and no improvement in roughness is achieved relative to ultra-high temperature heat treatment in an unbonded state (=SIMOX). By contrast, as a result of extensive research, the present inventors discovered that by using a substrate with a substrate resistivity of 1 to 100 mΩcm, such as a p+ substrate, the formation of $SiO_2$ progressed further and there was greater improvement in roughness than in common p− substrates (of which substrate resistivity is equal to or greater than 1 Ωcm). FIG. 3 shows results of observation by Atomic force microscope (AFM) on p−substrate and p+substrate.

The present invention was devised on that basis.

An aspect of the present invention relates to a method of manufacturing a bonded wafer comprising:

forming an oxygen ion implantation layer in an active layer wafer having a substrate resistivity ranging from 1 to 100 mΩcm by implanting oxygen ions in the active layer wafer, bonding a base wafer and the active layer wafer directly or through an insulating layer to form a bonded wafer, heat treating the bonded wafer to strengthen the bond and convert the oxygen ion implantation layer into a layer comprising $SiO_2$ phase particles or a continuous $SiO_2$ layer (hereinafter referred to as a "stop layer"), grinding, polishing, and/or etching, from the active layer wafer surface side, the bonded wafer in which the bond has been strengthened to expose the stop layer on a surface of the bonded wafer, removing the stop layer, and subjecting the bonded wafer from which the stop layer has been removed to a heat treatment under a reducing atmosphere to diffuse an electrically conductive component comprised in the active layer wafer.

The active layer wafer can be a p-type wafer.

The p-type wafer can comprise boron as an electrically conductive component.

The oxygen ion implantation layer can be formed in the active layer wafer to a depth of 200 to 1,000 nm from the surface on which the active layer wafer is to be bonded with the base wafer.

The base wafer can have an insulating layer and the active layer wafer and the base wafer can be bonded through the insulating layer.

The base wafer can have no insulating layer and the active layer wafer and the base wafer can be bonded directly.

The heat treatment for strengthening the bond and converting the oxygen ion implantation layer into a stop layer can be carried out at a temperature ranging from approximately 1000 to approximately 1300° C.

The stop layer can be exposed on the surface by grinding, from the active layer wafer surface side, the bonded wafer in which the bond has been strengthened to form a grinded surface, and then further polishing and/or etching the grinded surface.

The heat treatment for diffusing an electrically conductive component comprised in the active layer wafer can be carried out at temperature ranging from approximately 1000 to approximately 1200° C.

The present invention permits the manufacturing of a substrate (such as a SOI or DSB substrate) of low surface roughness by a bonding method employing a polish stop layer.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

DETAILED DESCRIPTION OF THE EMBODIMENTS

Figure 1:
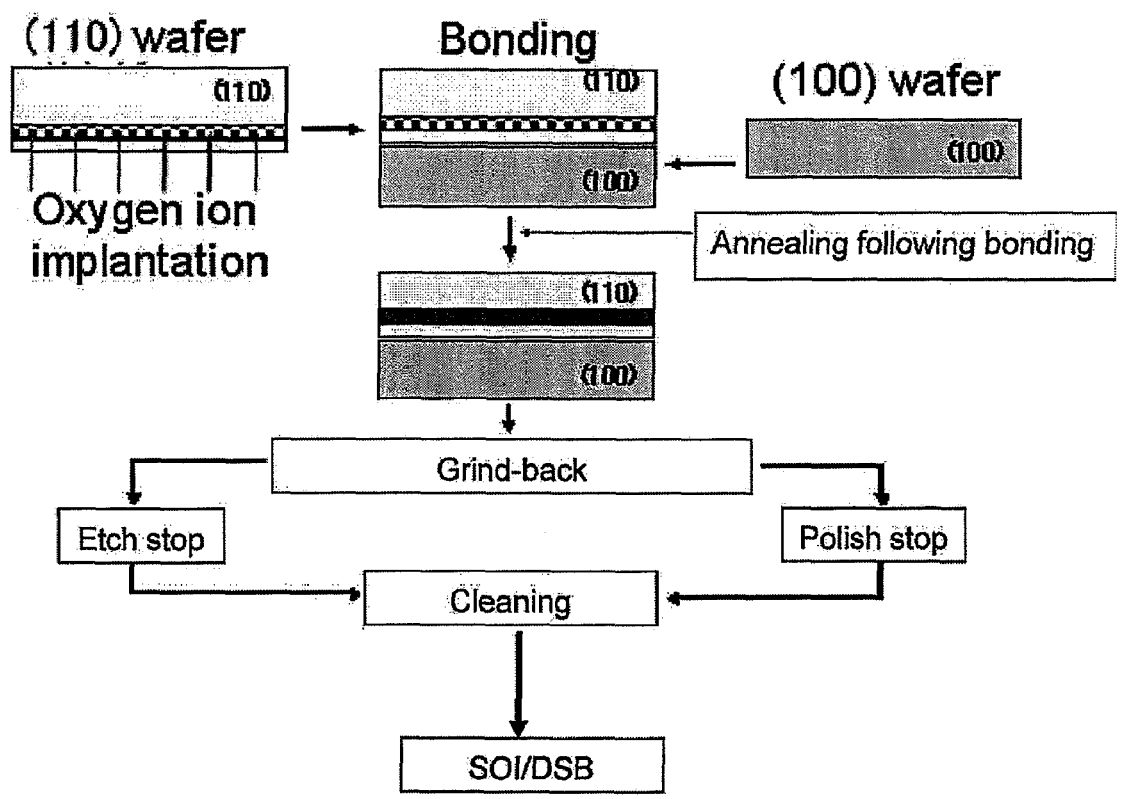
FIG. 1 is a descriptive drawing of oxygen ion-implantation—etch/polish stop bonding—SOI/DSB process.
Figure 2:
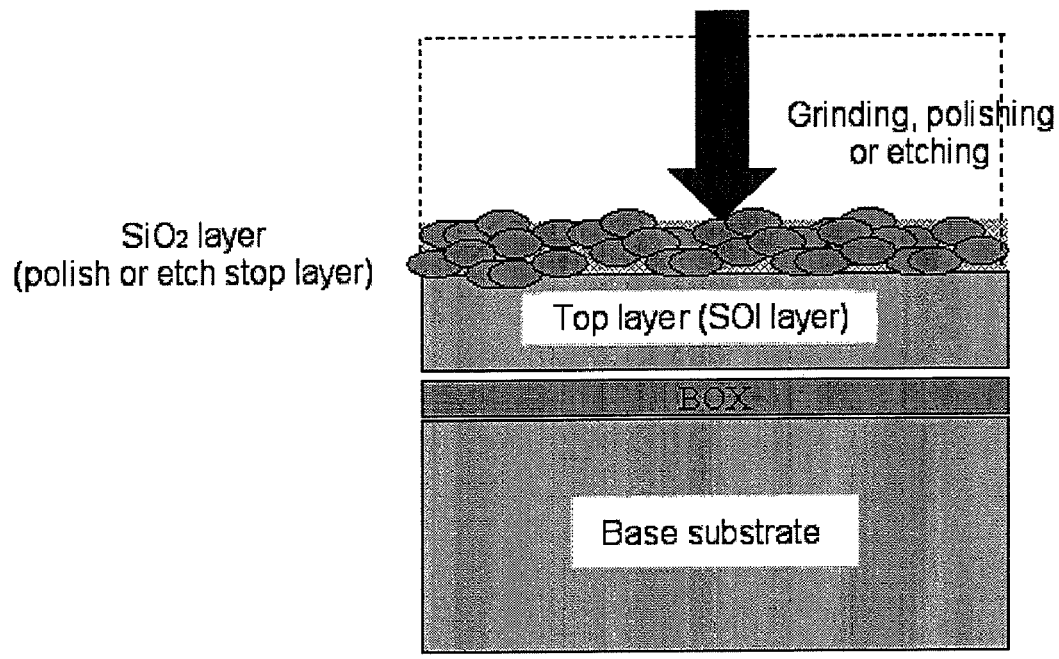
FIG. 2 is a descriptive drawing of oxygen ion implantation—etch stopping.
Figure 3A:
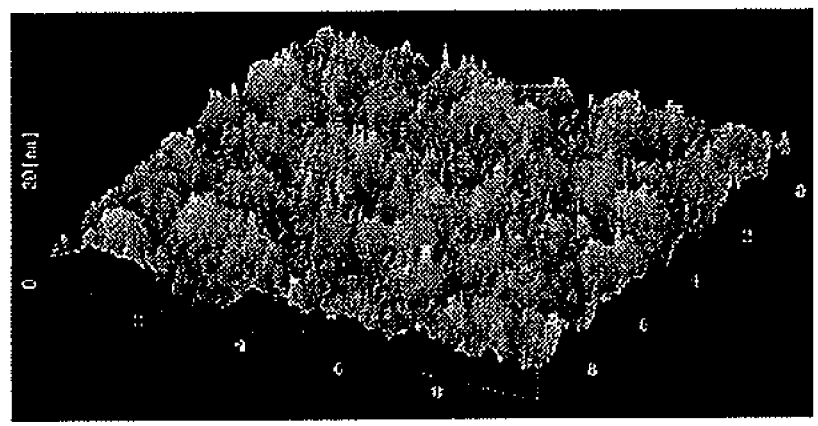
FIG. 3(a) shows the results of an analysis of the p− substrate, using an Atomic force microscope (AFM).
Figure 3B:
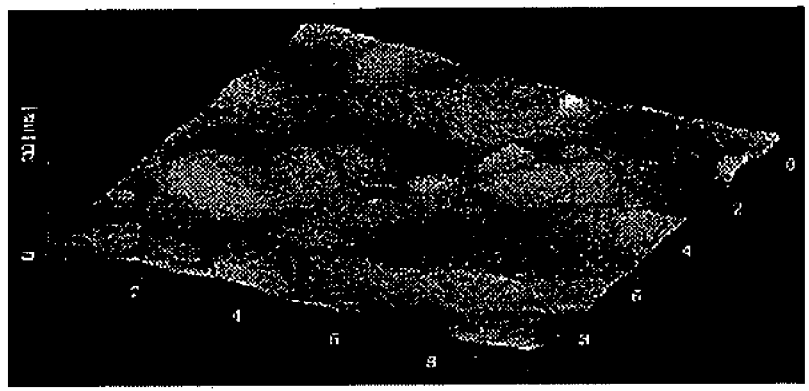
FIG. 3(b) shows the results of an analysis of the p+ substrate, using an Atomic force microscope (AFM).

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

The method of manufacturing a bonded wafer comprises the following steps:

(1) Forming an oxygen ion implantation layer in an active layer wafer having a substrate resistivity ranging from 1 to 100 mΩcm by implanting oxygen ions in the active layer wafer;

(2) Bonding a base wafer and the active layer wafer directly or through an insulating layer to form a bonded wafer;

(3) Heat treating the bonded wafer to strengthen the bond and convert the oxygen ion implantation layer into a layer comprising SiO2 phase particles or a continuous $SiO_2$ layer (stop layer);

(4) Grinding, polishing, and/or etching, from the active layer wafer surface side, the bonded wafer in which the bond has been strengthened to expose the stop layer on a surface of the bonded wafer;

(5) Removing the stop layer; and (6) Subjecting the bonded wafer from which the stop layer has been removed to a heat treatment under a reducing atmosphere to diffuse an electrically conductive component comprised in the active layer wafer.

Each of these steps will be described below.

(1) Forming an Oxygen Ion Implantation Layer

A silicon wafer having a substrate resistivity of 1 to 100 mΩcm is employed as the active layer wafer. The silicon wafer having a substrate resistivity of 1 to 100 mΩcm can be a p-type wafer, for example. More specifically, it can be a wafer comprising an electrically conductive component in the form of boron. Since a wafer with a substrate resistivity of less than 1 mΩcm does not readily lend itself to crystal pulling, a wafer with a substrate resistivity of equal to or greater than 1 mΩcm is employed in the present invention. Almost no effect in improving surface roughness by promoting the $SiO_2$ reaction is exhibited when the substrate resistivity exceeds 100 mΩcm, so the upper limit of substrate resistivity is set at 100 mΩcm. From the perspective of improving surface roughness, the substrate resistivity of the active layer wafer preferably falls within a range of 1 to 20 mΩcm.

Oxygen ions can be implanted in the active layer wafer by the usual methods. The conditions of oxygen ion implantation are suitably selected so that an oxygen ion implantation layer is formed to a depth of 200 to 1,000 nm from the surface of the active layer wafer, on which the active layer wafer is to be bonded with the base wafer.

(2) Bonding a Base Wafer and the Active Layer Wafer to Form a Bonded Wafer

The base wafer and the active layer wafer is bonded directly (with no insulating layer) or through an insulating layer to form a bonded wafer. Specifically, the base layer can have an insulating layer (such as a $SiO_2$ layer) on its surface, and the active layer wafer is bonded to the base wafer through the insulating layer. This yields a final product in the form of a SOI substrate. Alternatively, the base layer can have no insulating layer on its surface, and the active layer wafer and base wafer can be directly bonded. This yields a final product in the form of a DSB substrate.

(3) Strengthening the Bond and Forming $SiO_2$ Layer

The bonded wafer is heat treated to strengthen the bond and convert the oxygen ion implantation layer to a $SiO_2$ layer. The heat treatment in the step to strengthen the bond and convert the oxygen ion implantation layer to a stop layer can be conducted at a temperature ranging from 1,000 to 1,300° C. The atmosphere employed in the heat treatment is not specifically limited; the heat treatment may be conducted in an oxygen-containing oxidizing atmosphere or an atmosphere of an inert gas such as argon. The treatment period suitably falls within a range of 1 to 10 minutes.

To prevent scratching of the rear surface of the bonded wafer and surface roughness caused by etching in the step of exposing the surface of the stop layer, the treatment is preferably conducted in an oxygen atmosphere to form a $SiO_2$ film as a protective film. The film thickness of the $SiO_2$ film is preferably equal to or greater than 200 nm. Further, to promote the formation of the stop layer, a heat treatment can be conducted for equal to or greater than one hour at 1,000 to 1,200° C. prior to bonding. By conducting such heat treatment, a layer comprising $SiO_2$ phase particles or a continuous $SiO_2$ layer can be formed. The thickness of the layer varies based on the quantity of oxygen ions, but normally falls within a range of 100 to 3,000 nm.

(4) Exposing the Stop Layer Surface

The bonded wafer with a strengthened bond and in which a layer comprising $SiO_2$ phase particles or a continuous $SiO_2$ layer (stop layer) has been formed is ground, polished, and/or etched from the active layer wafer surface side to expose the stop layer on the surface of the bonded wafer. This step of exposing the stop layer surface may comprise, for example, grinding, from the active layer wafer surface side, the bonded wafer to form a grinded surface, and then further polishing and/or etching the grinded surface. In this step, the stop layer functions as an etching/polish stop layer. The polishing may be conducted using a grit-free alkali solution with a high polishing rate ratio of Si to $SiO_2$, for example. A high polishing rate ratio is desirable. The rate ratio is preferably equal to or greater than 10, more preferably equal to or greater than 100. Etching may be conducted with a KOH solution capable of etching just silicon, for example. However, the etching solution will seep between the $SiO_2$ particles in a stop layer in which $SiO_2$ phase particles are present in discontinuous fashion in silicon. Thus, when employing etching, it is desirable for the stop layer to be in the form of a continuous $SiO_2$ layer.

Removing the Stop Layer

After exposing the stop layer on the surface, the exposed stop layer is removed. The stop layer can be removed by HF treatment, for example. HF treatment can be conducted by immersion for 5 minutes (in a batch type cleaning apparatus) in an HF solution diluted to 1 percent, for example, to completely remove the stop layer. A stop layer comprised of $SiO_2$ phase particles present in discontinuous fashion in silicon can be removed by subjecting the stop layer to a heat treatment in an oxidizing atmosphere to convert it to a $SiO_2$ layer, followed by HF treatment.

(6) Diffusion of an Electrically Conductive Component

The bonded wafer from which the stop layer has been removed is subjected to a heat treatment under a reducing atmosphere to diffuse the electrically conductive component contained in the active layer wafer. As set forth above, the silicon wafer with a substrate resistivity of 1 to 100 mΩcm is employed as an active layer wafer, and the wafer can be a p-type wafer. More specifically, the wafer can be a wafer comprising boron as an electrically conductive component. For example, boron is diffused as an electrically conductive component in this step. The heat treatment can be conducted within a temperature range of 1,000 to 1,200° C. in the step of diffusing an electrically conductive component comprised in the active layer wafer. The duration of the heat treatment need only be adequate to diffuse the electrically conductive component comprised in the active layer wafer; for example, a duration ranging from 10 minutes to 10 hours can be employed.

A p-active layer (top) layer on which devices are formed is generally employed. To achieve this, following manufacture of a SOI substrate or DSB substrate, the substrate can be heat treated in argon or reducing atmosphere such as hydrogen to diffuse the boron present in the active wafer layer to the exterior.

The thickness of the active wafer (top) layer in the method of the present invention can be determined by the acceleration voltage of the oxygen ion implanter. The maximum acceleration voltage of common commercial oxygen ion implanters is 200 keV and the maximum top layer thickness is about 500 nm. To effect external diffusion of boron to this depth, it is suitable to maintain a temperature of equal to or greater than 1,050° C. for equal to or more than one hour.

EXAMPLES

The present invention will be described in detail below based on examples. However, the present invention is not limited to the examples.

Example 1

A bonded wafer with a SOI structure was fabricated by the following steps (1) to (9):

(1) A 300 mm base wafer was prepared. The 300 mm base wafer was a p-type wafer (100) with a substrate resistivity of 10 to 20 Ωcm and had a BOX layer (1,500 Angstroms) formed by heat treatment in an oxygen atmosphere for 5 hours at 1,000° C.

(2) A 300 mm active layer wafer (top substrate) was prepared. The 300 mm active layer wafer was a p-type wafer (100) with a substrate resistivity ranging from 0.001 to 10 Ωcm (as described, in detail, in Table 1) that had an oxygen ion implantation layer. The oxygen ion implantation layer was formed under conditions of an acceleration voltage of 180 keV, a dose of $2e17 cm^{-2}$, and a substrate temperature of 100 to 500° C.

(3) The base wafer and active layer wafer were SC1 washed and bonded.

(4) Following bonding, a bond-strengthening heat treatment was conducted for 1 hour at 1,200° C. (in an oxygen atmosphere).

(5) The surface of the active layer wafer was subjected to substrate grinding and polishing until a thickness of about 10 micrometers remained.

(6) Following grinding and polishing, a grit-free alkali polishing solution was used to polish until it stopped at the $SiO_2$ layer. This polishing may be replaced by etching with an alkali solution.

(7) Next, the $SiO_2$ layer was removed with an HF solution (25 percent concentration).

(8) External diffusion processing was then conducted by maintaining the bonded wafer at 1,000 to 1,200° C. for one hour (in an argon atmosphere).

(9) The bonded wafer obtained was evaluated as follows.

Roughness evaluation by AFM (conducted following step (7)); the results are shown in Table 1.

Evaluation of the boron concentration (conducted following step (8) (partial)) in the active layer wafer (top wafer) by SIMS; the results are shown in Table 2.

Example 2

A bonded wafer with a DSB structure was fabricated by the following steps (1) to (9):

(1) A 300 mm base wafer was prepared. The 300 mm base wafer was a p-type wafer (100) with a substrate resistivity of 10 to 20 Ωcm.

(2) A 300 mm active layer wafer (top substrate) was prepared. The 300 mm active layer wafer was a p-type wafer (110) with a substrate resistivity ranging from 0.001 to 10 Ωcm (as shown in Table 1) that had an oxygen ion implantation layer. The oxygen ion implantation layer was formed under conditions of an acceleration voltage of 180 keV, a dose of 2e17 cm$^{-2}$, and a substrate temperature of 100 to 500° C.

Steps (3) to (9) were implemented in the same manner as in Example 1.

The evaluation results are given in Table 1.

TABLE 1

Relation between resistivity and roughness

| | Structure | Top substrate resistivity [Ωcm] | Surface roughness RMS [Angstroms] (10 μm × 10 μm) |
|---|---|---|---|
| 1 Comp. Ex. | SOI | 10 | 11.0 |
| 2 Comp. Ex. | SOI | 1 | 12.2 |
| 3 Comp. Ex. | SOI | 0.2 | 12.7 |
| 4 Example of present invention | SOI | 0.1 | 7.3 |
| 5 Ex. of present invention | SOI | 0.02 | 4.3 |
| 6 Ex. of present invention | SOI | 0.01 | 3.1 |
| 7 Ex. of present invention | SOI | 0.001 | 3.2 |
| 8 Comp. Ex. | DSB | 10 | 15.5 |
| 9 Comp. Ex. | DSB | 1 | 16.9 |
| 10 Comp. Ex. | DSB | 0.2 | 13.0 |
| 11 Ex. of present invention | DSB | 0.02 | 7.2 |
| 12 Ex. of present invention | DSB | 0.01 | 6.8 |
| 13 Ex. of present invention | DSB | 0.001 | 6.5 |

TABLE 2

Conditions of treatment in reducing atmosphere and boron concentration of top layer
Top substrate resistivity 1 mΩcm-boron concentration = 1e18/cm$^3$

| | | Structure | Heat treatment temp. [° C.] | Heat Treatment period [hr] | Top substrate resistivity boron concentration [1/cm$^3$] |
|---|---|---|---|---|---|
| 1 | Comp. Ex. | SOI | 1000 | 1 | 8e17 |
| 2 | Comp. Ex. | SOI | 1050 | 0.5 | 3e17 |
| 3 | Comp. Ex. | SOI | 1050 | 1 | <1e17 |
| 4 | Ex. of present invention | SOI | 1100 | 1 | <1e17 |
| 5 | Ex. of present invention | SOI | 1150 | 1 | <1e17 |
| 6 | Ex. of present invention | SOI | 1200 | 1 | <1e17 |

The manufacturing method of the present invention can be utilized for both silicon-on-insulator (SOI) substrates and direct-silicon-bonding (DSB) substrates.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of manufacturing a bonded wafer comprising:
   forming an oxygen ion implantation layer in an active layer wafer having a substrate resistivity ranging from 1 to 100 mΩcm by implanting oxygen ions in the active layer wafer,
   bonding a base wafer and the active layer wafer directly or through an insulating layer to form a bonded wafer,
   heat treating the bonded wafer to strengthen a bond between the base wafer and the active layer and convert the oxygen ion implantation layer into a stop layer, wherein the stop layer is a layer comprising SiO$_2$ phase particles or a continuous SiO$_2$ layer, grinding, polishing, and/or etching, from a surface of the active layer, the bonded wafer in which the bond has been strengthened to expose the stop layer on a surface of the bonded wafer, removing the stop layer, and subjecting the bonded wafer from which the stop layer has been removed to heat treatment under a reducing atmosphere to diffuse an electrically conductive component comprised in the active layer wafer.

2. The method according to claim 1, wherein the oxygen ion implantation layer is formed in the active layer wafer at a depth of 200 to 1,000 nm from the surface on which the active layer wafer is to be bonded with the base wafer.

3. The method according to claim 1, wherein the base wafer has an insulating layer and the active layer wafer and the base wafer is bonded through the insulating layer.

4. The method according to claim 1, wherein the base wafer has no insulating layer and the active layer wafer and the base wafer is bonded directly.

5. The method according to claim 1, wherein the heat treatment for strengthening the bond and converting the oxygen ion implantation layer into the stop layer is carried out at a temperature ranging from 1000 to 1300° C.

6. The method according to claim 1, wherein the stop layer is exposed on the surface of the bonded wafer by grinding the bonded wafer, from the surface of the active layer, in which the bond has been strengthened to form a grinded surface, and further polishing and/or etching the grinded surface.

7. The method according to claim 1, wherein the heat treatment for diffusing an electrically conductive component in the active layer of the bonded wafer is carried out at temperature ranging from 1000 to 1200° C.

8. The method according to claim 1, wherein the active layer wafer is a p-type wafer.

9. The method according to claim 8, wherein the p-type wafer comprises boron as an electrically conductive component.

* * * * *